US008921733B2

(12) United States Patent
Gaudiosi et al.

(10) Patent No.: US 8,921,733 B2
(45) Date of Patent: Dec. 30, 2014

(54) METHODS AND SYSTEMS FOR TRIMMING CIRCUITS

(75) Inventors: David Gaudiosi, Santa Rosa, CA (US); Laurent Vaissie, Sherman Oaks, CA (US)

(73) Assignee: Raydiance, Inc., Petaluma, CA (US)

( * ) Notice: Subject to any disclaimer, the term of this patent is extended or adjusted under 35 U.S.C. 154(b) by 7 days.

(21) Appl. No.: 13/446,879

(22) Filed: Apr. 13, 2012

(65) Prior Publication Data
US 2012/0217230 A1    Aug. 30, 2012

Related U.S. Application Data

(63) Continuation-in-part of application No. 11/538,048, filed on Oct. 2, 2006, now Pat. No. 8,173,929, which is (Continued)

(51) Int. Cl.
*B23K 26/04* (2014.01)
*B23K 26/00* (2014.01)
(Continued)

(52) U.S. Cl.
CPC ......... *B23K 26/0635* (2013.01); *B23K 26/4075* (2013.01); *H01C 17/242* (2013.01);
(Continued)

(58) Field of Classification Search
CPC ..... B23K 26/032; B23K 26/03; B23K 26/422
USPC ............ 219/121.61, 121.62, 121.68, 121.69, 219/121.71, 121.83, 121.73, 121.76, 219/121.77; 324/71.1; 250/455.11, 559.13; 73/12.08; 382/141–154; 438/690, 940
See application file for complete search history.

(56) References Cited

U.S. PATENT DOCUMENTS 3,549,256 A    12/1970    Brienza et al.
3,602,836 A    8/1971    Young
(Continued)

FOREIGN PATENT DOCUMENTS

DE    WO2007000194 A1    4/2007
EP    0214100    3/1987
(Continued)

OTHER PUBLICATIONS

Siegman, "Unstable Optical Resonators", Applied Optics, Feb. 1974, pp. 353-367, vol. 13, No. 2.
(Continued)

*Primary Examiner* — Dana Ross
*Assistant Examiner* — Gyounghyun Bae
(74) *Attorney, Agent, or Firm* — Haverstock & Owens LLP

(57) ABSTRACT

Removing material from the surface of a first circuit comprises generating a first laser pulse using a pulse generator; targeting a spot on the first circuit using a focusing component; delivering the first laser pulse to the spot on the first circuit, the first circuit including a digital component; ablating material from the spot using the first laser pulse without changing a state of the digital component; testing performance of the first circuit, the testing being performed without reinitializing the circuit between the steps of ablating material and testing performance. Targeting the spot on the first circuit comprises generating a second laser pulse using a pulse generator; delivering a second laser pulse to a sacrificial piece of material; detecting the position of the ablation caused by the second laser pulse with a vision system that forms an image; and using this image to guide the first laser to the spot.

26 Claims, 3 Drawing Sheets

Related U.S. Application Data a continuation-in-part of application No. 10/957,271, filed on Oct. 1, 2004, now Pat. No. 7,115,514, which is a continuation-in-part of application No. 10/916,366, filed on Aug. 11, 2004, now abandoned.

(60) Provisional application No. 60/508,136, filed on Oct. 2, 2003, provisional application No. 60/494,102, filed on Aug. 11, 2003, provisional application No. 60/494,275, filed on Aug. 11, 2003, provisional application No. 60/494,274, filed on Aug. 11, 2003, provisional application No. 60/503,578, filed on Sep. 17, 2003, provisional application No. 60/512,807, filed on Oct. 20, 2003.

(51) Int. Cl.

| | | |
|---|---|---|
| *B23K 26/06* | (2014.01) | |
| *B23K 26/02* | (2014.01) | |
| *G06K 9/00* | (2006.01) | |
| *G01N 23/00* | (2006.01) | |
| *G01N 21/86* | (2006.01) | |
| *G01M 7/00* | (2006.01) | |
| *B23K 26/40* | (2014.01) | |
| *H01C 17/242* | (2006.01) | |
| *H01L 21/66* | (2006.01) | |
| *B23K 26/36* | (2014.01) | |

(52) U.S. Cl.
CPC .......... *B23K 2201/40* (2013.01); *B23K 26/407* (2013.01); *H01L 22/20* (2013.01); *H01L 22/14* (2013.01); *B23K 26/365* (2013.01); *B23K 26/0003* (2013.01)
USPC ............ 219/121.62; 219/121.61; 219/121.68; 219/121.69; 219/121.71; 219/121.73; 219/121.76; 219/121.77; 219/121.83; 382/141; 382/142; 382/143; 382/144; 382/145; 382/146; 382/147; 382/148; 382/149; 382/150; 382/151; 382/152; 382/153; 382/154; 382/71.1; 250/455.11; 250/559.13; 73/12.08

(56) References Cited

U.S. PATENT DOCUMENTS

| | | |
|---|---|---|
| 3,622,907 A | 11/1971 | Tomlinson et al. |
| 3,628,179 A | 12/1971 | Cuff |
| 3,631,362 A | 12/1971 | Almasi |
| 3,654,624 A | 4/1972 | Becker et al. |
| 3,696,308 A | 10/1972 | Duffy et al. |
| 3,735,282 A | 5/1973 | Gans |
| 3,764,641 A | 10/1973 | Ash |
| 3,808,549 A | 4/1974 | Maurer |
| 3,851,267 A | 11/1974 | Tanner |
| 3,942,127 A | 3/1976 | Fluhr et al. |
| 3,963,953 A | 6/1976 | Thornton, Jr. |
| 4,194,813 A | 3/1980 | Benjamin et al. |
| 4,389,617 A | 6/1983 | Kurnit |
| 4,394,623 A | 7/1983 | Kurnit |
| 4,449,215 A | 5/1984 | Reno |
| 4,590,598 A | 5/1986 | O'Harra, II |
| 4,622,095 A | 11/1986 | Grobman et al. |
| 4,655,547 A | 4/1987 | Heritage et al. |
| 4,673,795 A | 6/1987 | Ortiz, Jr. |
| 4,718,418 A | 1/1988 | L'Esperance, Jr. |
| 4,722,591 A | 2/1988 | Haffner |
| 4,743,769 A * | 5/1988 | Schwaiger et al. ...... 250/559.19 |
| 4,750,809 A | 6/1988 | Kafka et al. |
| 4,815,079 A | 3/1989 | Snitzer et al. |
| 4,824,598 A | 4/1989 | Stokowski |
| 4,829,529 A | 5/1989 | Kafka |
| 4,849,036 A | 7/1989 | Powell et al. |
| 4,878,127 A | 10/1989 | Zollman et al. |
| 4,907,586 A | 3/1990 | Bille et al. |
| 4,913,520 A | 4/1990 | Kafka |
| 4,915,757 A | 4/1990 | Rando |
| 4,928,316 A | 5/1990 | Heritage et al. |
| 4,972,423 A | 11/1990 | Alfano et al. |
| 4,983,034 A | 1/1991 | Spillman, Jr. |
| 4,988,348 A | 1/1991 | Bille |
| 4,994,059 A | 2/1991 | Kosa et al. |
| 5,010,555 A | 4/1991 | Madey et al. |
| 5,014,290 A | 5/1991 | Moore et al. |
| 5,022,042 A | 6/1991 | Bradley |
| 5,043,991 A | 8/1991 | Bradley |
| 5,053,171 A | 10/1991 | Portney et al. |
| 5,095,487 A | 3/1992 | Meyerhofer et al. |
| 5,098,426 A | 3/1992 | Sklar et al. |
| 5,122,439 A | 6/1992 | Miersch et al. |
| 5,132,996 A | 7/1992 | Moore et al. |
| 5,146,088 A | 9/1992 | Kingham et al. |
| 5,162,643 A | 11/1992 | Currie |
| 5,166,818 A | 11/1992 | Chase et al. |
| 5,187,759 A | 2/1993 | DiGiovanni et al. |
| 5,194,713 A | 3/1993 | Egitto et al. |
| 5,217,003 A | 6/1993 | Wilk |
| 5,233,182 A | 8/1993 | Szabo et al. |
| 5,237,576 A | 8/1993 | DiGiovanni et al. |
| 5,255,117 A | 10/1993 | Cushman |
| 5,257,273 A | 10/1993 | Farries et al. |
| 5,265,107 A | 11/1993 | Delfyett, Jr. |
| 5,265,114 A * | 11/1993 | Sun et al. ................. 372/69 |
| 5,267,077 A | 11/1993 | Blonder |
| 5,278,853 A | 1/1994 | Shirai et al. |
| 5,286,947 A * | 2/1994 | Clyde et al. ............. 219/121.83 |
| 5,291,501 A | 3/1994 | Hanna |
| 5,293,186 A | 3/1994 | Seden et al. |
| 5,302,835 A | 4/1994 | Bendett et al. |
| 5,313,262 A | 5/1994 | Leonard |
| 5,315,431 A | 5/1994 | Masuda et al. |
| 5,315,436 A | 5/1994 | Lowenhar et al. |
| 5,329,398 A | 7/1994 | Lai et al. |
| 5,331,131 A | 7/1994 | Opdyke |
| 5,367,143 A | 11/1994 | White, Jr. |
| 5,400,350 A | 3/1995 | Galvanauskas |
| 5,409,376 A | 4/1995 | Murphy |
| 5,411,918 A | 5/1995 | Keible et al. |
| 5,414,725 A | 5/1995 | Fermann et al. |
| 5,418,809 A | 5/1995 | August, Jr. et al. |
| 5,430,572 A | 7/1995 | DiGiovanni et al. |
| 5,440,573 A | 8/1995 | Fermann |
| 5,446,813 A | 8/1995 | Lee et al. |
| 5,450,427 A | 9/1995 | Fermann et al. |
| 5,479,422 A | 12/1995 | Fermann et al. |
| 5,489,984 A | 2/1996 | Hariharan et al. |
| 5,499,134 A | 3/1996 | Galvanauskas et al. |
| 5,520,679 A | 5/1996 | Lin |
| 5,533,139 A * | 7/1996 | Parker et al. ................. 382/108 |
| 5,548,098 A | 8/1996 | Sugawara et al. |
| 5,572,358 A | 11/1996 | Gabl et al. |
| 5,590,142 A | 12/1996 | Shan |
| 5,592,327 A | 1/1997 | Gabl et al. |
| 5,596,668 A | 1/1997 | DiGiovanni et al. |
| 5,602,673 A | 2/1997 | Swan |
| 5,602,677 A | 2/1997 | Tournois |
| 5,615,043 A | 3/1997 | Plaessmann et al. |
| 5,617,434 A | 4/1997 | Tamura et al. |
| 5,624,587 A | 4/1997 | Otsuki et al. |
| 5,625,544 A | 4/1997 | Kowshik et al. |
| 5,627,848 A | 5/1997 | Fermann et al. |
| 5,631,771 A | 5/1997 | Swan |
| 5,633,885 A | 5/1997 | Galvanauskas et al. |
| 5,642,447 A | 6/1997 | Pan et al. |
| 5,644,424 A | 7/1997 | Backus et al. |
| 5,651,018 A | 7/1997 | Mehuys et al. |
| 5,656,186 A * | 8/1997 | Mourou et al. .......... 219/121.69 |
| 5,657,153 A | 8/1997 | Endriz et al. |
| 5,661,829 A | 8/1997 | Zheng |
| 5,666,722 A | 9/1997 | Tamm et al. |
| 5,670,067 A | 9/1997 | Koide et al. |
| 5,677,769 A | 10/1997 | Bendett |
| 5,681,490 A * | 10/1997 | Chang ...................... 219/121.64 |

(56) References Cited

U.S. PATENT DOCUMENTS

| | | | |
|---|---|---|---|
| 5,689,361 A | 11/1997 | Damen et al. |
| 5,689,519 A | 11/1997 | Fermann et al. |
| 5,694,501 A | 12/1997 | Alavie et al. |
| 5,696,782 A | 12/1997 | Harter et al. |
| 5,701,319 A | 12/1997 | Fermann |
| 5,708,669 A | 1/1998 | DiGiovanni et al. |
| 5,720,894 A | 2/1998 | Neev et al. |
| 5,726,855 A | 3/1998 | Mourou et al. |
| 5,734,762 A | 3/1998 | Ho et al. |
| 5,736,709 A | 4/1998 | Neiheisel |
| 5,771,253 A | 6/1998 | Chang-Hasnain et al. |
| 5,778,016 A | 7/1998 | Sucha et al. |
| 5,781,289 A | 7/1998 | Sabsabi et al. |
| 5,786,117 A | 7/1998 | Hoshi et al. |
| 5,788,688 A | 8/1998 | Bauer et al. |
| 5,790,574 A | 8/1998 | Rieger et al. |
| 5,815,519 A | 9/1998 | Aoshima et al. |
| 5,818,630 A | 10/1998 | Fermann et al. |
| 5,822,097 A | 10/1998 | Tournois |
| 5,841,099 A * | 11/1998 | Owen et al. ............... 219/121.69 |
| 5,844,149 A | 12/1998 | Akiyoshi et al. |
| 5,847,825 A | 12/1998 | Alexander |
| 5,847,863 A | 12/1998 | Galvanauskas et al. |
| 5,862,287 A | 1/1999 | Stock et al. |
| 5,862,845 A | 1/1999 | Chin et al. |
| 5,867,304 A | 2/1999 | Galvanauskas et al. |
| 5,875,408 A | 2/1999 | Bendett et al. |
| 5,880,877 A | 3/1999 | Fermann et al. |
| 5,898,485 A | 4/1999 | Nati, Jr. |
| 5,903,662 A * | 5/1999 | DeCarlo ....................... 382/151 |
| 5,907,157 A | 5/1999 | Yoshioka et al. |
| 5,920,668 A | 7/1999 | Uehara et al. |
| 5,923,686 A | 7/1999 | Fermann et al. |
| 5,933,271 A | 8/1999 | Waarts et al. |
| 5,994,667 A | 11/1999 | Merdan et al. |
| 5,999,847 A | 12/1999 | Elstrom |
| 6,014,249 A | 1/2000 | Fermann et al. |
| 6,016,452 A | 1/2000 | Kasevich |
| 6,020,591 A | 2/2000 | Harter et al. |
| 6,034,975 A | 3/2000 | Harter et al. |
| 6,061,373 A | 5/2000 | Brockman et al. |
| 6,071,276 A | 6/2000 | Abela |
| 6,072,811 A | 6/2000 | Fermann et al. |
| 6,075,220 A * | 6/2000 | Essien et al. ............. 219/121.63 |
| 6,081,369 A | 6/2000 | Waarts et al. |
| 6,088,153 A | 7/2000 | Anthon et al. |
| 6,099,522 A | 8/2000 | Knopp et al. |
| 6,120,857 A | 9/2000 | Balooch et al. |
| 6,122,097 A | 9/2000 | Weston et al. |
| 6,130,780 A | 10/2000 | Joannopoulos et al. |
| 6,141,140 A | 10/2000 | Kim |
| 6,151,338 A | 11/2000 | Grubb et al. |
| 6,154,310 A | 11/2000 | Galvanauskas et al. |
| 6,156,030 A * | 12/2000 | Neev ............................. 606/10 |
| 6,161,543 A | 12/2000 | Cox et al. |
| 6,168,590 B1 | 1/2001 | Neev |
| 6,175,437 B1 | 1/2001 | Diels et al. |
| 6,181,463 B1 | 1/2001 | Galvanauskas et al. |
| 6,190,380 B1 | 2/2001 | Abela |
| 6,198,568 B1 | 3/2001 | Galvanauskas et al. |
| 6,198,766 B1 | 3/2001 | Schuppe et al. |
| 6,201,914 B1 | 3/2001 | Duguay et al. |
| 6,208,458 B1 | 3/2001 | Galvanauskas et al. |
| 6,211,485 B1 * | 4/2001 | Burgess ...................... 219/121.7 |
| 6,228,748 B1 | 5/2001 | Anderson et al. |
| 6,246,816 B1 | 6/2001 | Moore et al. |
| 6,249,630 B1 | 6/2001 | Stock et al. |
| 6,252,892 B1 | 6/2001 | Jiang et al. |
| 6,256,328 B1 | 7/2001 | Delfyett et al. |
| 6,269,108 B1 | 7/2001 | Tabirian et al. |
| 6,275,250 B1 | 8/2001 | Sanders et al. |
| 6,275,512 B1 | 8/2001 | Fermann |
| 6,281,471 B1 | 8/2001 | Smart |
| 6,314,115 B1 | 11/2001 | Delfyett et al. |
| 6,325,792 B1 | 12/2001 | Swinger et al. |
| 6,327,074 B1 | 12/2001 | Bass et al. |
| 6,327,282 B2 | 12/2001 | Hammons et al. |
| 6,330,383 B1 | 12/2001 | Cai et al. |
| 6,334,011 B1 | 12/2001 | Galvanauskas et al. |
| 6,334,017 B1 | 12/2001 | West |
| 6,335,821 B1 | 1/2002 | Suzuki et al. |
| 6,340,806 B1 | 1/2002 | Smart et al. |
| 6,344,625 B1 * | 2/2002 | Kim et al. ................. 219/121.62 |
| RE37,585 E | 3/2002 | Mourou et al. |
| 6,355,908 B1 | 3/2002 | Tatah et al. |
| 6,362,454 B1 | 3/2002 | Liu |
| 6,365,869 B1 | 4/2002 | Swain et al. |
| 6,370,171 B1 | 4/2002 | Horn et al. |
| 6,370,422 B1 | 4/2002 | Richards-Kortum et al. |
| 6,371,469 B1 | 4/2002 | Gray |
| 6,400,871 B1 | 6/2002 | Minden |
| 6,404,944 B1 | 6/2002 | Wa et al. |
| 6,407,363 B2 | 6/2002 | Dunsky et al. |
| 6,418,154 B1 | 7/2002 | Kneip et al. |
| 6,418,256 B1 | 7/2002 | Danziger et al. |
| 6,421,169 B1 | 7/2002 | Bonnedal et al. |
| 6,425,912 B1 | 7/2002 | Knowlton |
| 6,433,301 B1 * | 8/2002 | Dunsky et al. ........... 219/121.67 |
| 6,433,303 B1 | 8/2002 | Liu et al. |
| 6,433,305 B1 | 8/2002 | Liu et al. |
| 6,433,760 B1 | 8/2002 | Vaissie et al. |
| 6,437,283 B1 | 8/2002 | Wiggermann et al. |
| 6,463,314 B1 | 10/2002 | Haruna |
| 6,482,199 B1 | 11/2002 | Neev |
| 6,485,413 B1 | 11/2002 | Boppart et al. |
| 6,486,435 B1 | 11/2002 | Beyer et al. |
| 6,496,099 B2 | 12/2002 | Wang et al. |
| 6,501,590 B2 | 12/2002 | Bass et al. |
| 6,522,460 B2 | 2/2003 | Bonnedal et al. |
| 6,526,327 B2 | 2/2003 | Kar et al. |
| 6,541,731 B2 | 4/2003 | Mead et al. |
| 6,549,547 B2 | 4/2003 | Galvanauskas et al. |
| 6,552,301 B2 | 4/2003 | Herman et al. |
| 6,555,781 B2 | 4/2003 | Ngoi et al. |
| 6,556,733 B2 | 4/2003 | Dy et al. |
| 6,562,698 B2 | 5/2003 | Manor |
| 6,566,888 B1 * | 5/2003 | Bruce et al. .................... 324/525 |
| 6,567,431 B2 | 5/2003 | Tabirian et al. |
| 6,570,704 B2 | 5/2003 | Palese |
| 6,573,813 B1 | 6/2003 | Joannopoulos et al. |
| 6,574,024 B1 | 6/2003 | Liu |
| 6,574,250 B2 | 6/2003 | Sun et al. |
| 6,580,553 B2 | 6/2003 | Kim et al. |
| 6,583,381 B1 * | 6/2003 | Duignan ................... 219/121.69 |
| 6,587,488 B1 | 7/2003 | Meissner et al. |
| 6,592,574 B1 | 7/2003 | Shimmick et al. |
| 6,593,753 B2 * | 7/2003 | Scott et al. ..................... 324/637 |
| 6,597,497 B2 | 7/2003 | Wang et al. |
| 6,603,903 B1 | 8/2003 | Tong et al. |
| 6,603,911 B2 | 8/2003 | Fink et al. |
| 6,614,565 B1 | 9/2003 | Klug et al. |
| 6,621,040 B1 | 9/2003 | Perry et al. |
| 6,621,045 B1 | 9/2003 | Liu et al. |
| 6,627,421 B1 | 9/2003 | Unger et al. |
| 6,627,844 B2 | 9/2003 | Liu et al. |
| 6,642,477 B1 | 11/2003 | Patel et al. |
| 6,647,031 B2 | 11/2003 | Delfyett et al. |
| 6,654,161 B2 | 11/2003 | Bass et al. |
| 6,661,568 B2 | 12/2003 | Hollemann et al. |
| 6,661,816 B2 | 12/2003 | Delfyett et al. |
| 6,671,298 B1 | 12/2003 | Delfyett et al. |
| 6,677,552 B1 | 1/2004 | Tulloch et al. |
| 6,681,079 B1 | 1/2004 | Maroney |
| 6,687,000 B1 * | 2/2004 | White ............................ 356/328 |
| 6,695,835 B2 | 2/2004 | Furuno et al. |
| 6,696,008 B2 | 2/2004 | Brandinger |
| 6,697,408 B2 | 2/2004 | Kennedy et al. |
| 6,700,094 B1 | 3/2004 | Kuntze |
| 6,700,698 B1 | 3/2004 | Scott |
| 6,706,036 B2 | 3/2004 | Lai |
| 6,710,288 B2 | 3/2004 | Liu et al. |
| 6,710,293 B2 | 3/2004 | Liu et al. |
| 6,711,334 B2 | 3/2004 | Szkopek et al. |
| 6,716,475 B1 | 4/2004 | Fink et al. |

(56) References Cited

U.S. PATENT DOCUMENTS

| | | | |
|---|---|---|---|
| 6,720,519 B2 | 4/2004 | Liu et al. |
| 6,723,991 B1 | 4/2004 | Sucha et al. |
| 6,724,508 B2 | 4/2004 | Pierce et al. |
| 6,727,458 B2 | 4/2004 | Smart |
| 6,728,273 B2 | 4/2004 | Perry |
| 6,735,368 B2 | 5/2004 | Parker et al. |
| 6,738,144 B1 | 5/2004 | Dogariu |
| 6,744,552 B2 | 6/2004 | Scalora et al. |
| 6,744,555 B2 | 6/2004 | Galvanauskas et al. |
| 6,747,795 B2 | 6/2004 | Lin et al. |
| 6,749,285 B2 | 6/2004 | Liu et al. |
| 6,760,356 B2 | 7/2004 | Erbert et al. |
| 6,765,724 B1 | 7/2004 | Kramer |
| 6,774,869 B2 | 8/2004 | Biocca et al. |
| 6,785,303 B1 | 8/2004 | Holzwarth et al. |
| 6,785,445 B2 | 8/2004 | Kuroda et al. |
| 6,787,733 B2 | 9/2004 | Lubatschowski et al. |
| 6,787,734 B2 | 9/2004 | Liu |
| 6,788,864 B2 | 9/2004 | Ahmad et al. |
| 6,791,060 B2 | 9/2004 | Dunsky et al. |
| 6,791,071 B2 | 9/2004 | Woo et al. |
| 6,795,461 B1 | 9/2004 | Blair et al. |
| 6,801,550 B1 | 10/2004 | Snell et al. |
| 6,801,557 B2 | 10/2004 | Liu |
| 6,803,539 B2 | 10/2004 | Liu et al. |
| 6,804,574 B2 | 10/2004 | Liu et al. |
| 6,807,353 B1 | 10/2004 | Fleming et al. |
| 6,819,702 B2 | 11/2004 | Sverdlov et al. |
| 6,819,837 B2 | 11/2004 | Li et al. |
| 6,822,187 B1 | 11/2004 | Hermann et al. |
| 6,822,251 B1 | 11/2004 | Arenberg et al. |
| 6,824,540 B1 | 11/2004 | Lin |
| 6,829,517 B2 | 12/2004 | Cheng et al. |
| 6,834,134 B2 | 12/2004 | Brennan, III et al. |
| 6,836,703 B2 | 12/2004 | Wang et al. |
| 6,878,900 B2 | 4/2005 | Corkum et al. |
| 6,882,772 B1 | 4/2005 | Lowery et al. |
| 6,885,683 B1 | 4/2005 | Fermann et al. |
| 6,887,804 B2 | 5/2005 | Sun et al. |
| 6,897,405 B2 | 5/2005 | Cheng et al. |
| 6,902,561 B2 | 6/2005 | Kurtz et al. |
| 6,915,040 B2 | 7/2005 | Willner et al. |
| 6,937,629 B2 | 8/2005 | Perry et al. |
| 6,943,359 B2 | 9/2005 | Vardeny et al. |
| 6,956,680 B2 | 10/2005 | Morbieu et al. |
| 6,994,703 B2 | 2/2006 | Wang et al. |
| 6,998,569 B2 * | 2/2006 | Schumacher ............ 219/121.63 |
| 7,001,373 B2 | 2/2006 | Clapham et al. |
| 7,002,733 B2 | 2/2006 | Dagenais et al. |
| 7,006,730 B2 | 2/2006 | Doerr |
| 7,022,119 B2 | 4/2006 | Hohla |
| 7,031,571 B2 | 4/2006 | Mihailov et al. |
| 7,072,101 B2 | 7/2006 | Kapteyn et al. |
| 7,088,756 B2 | 8/2006 | Fermann et al. |
| 7,095,772 B1 | 8/2006 | Delfyett et al. |
| 7,097,640 B2 | 8/2006 | Wang et al. |
| 7,099,549 B2 | 8/2006 | Scheuer et al. |
| 7,116,688 B2 | 10/2006 | Sauter et al. |
| 7,132,289 B2 | 11/2006 | Kobayashi et al. |
| 7,143,769 B2 | 12/2006 | Stoltz et al. |
| 7,171,074 B2 | 1/2007 | DiGiovanni et al. |
| 7,217,266 B2 | 5/2007 | Anderson et al. |
| 7,220,255 B2 | 5/2007 | Lai |
| 7,233,607 B2 | 6/2007 | Richardson et al. |
| 7,257,302 B2 | 8/2007 | Fermann et al. |
| 7,283,242 B2 * | 10/2007 | Thornton ...................... 356/432 |
| 7,289,707 B1 | 10/2007 | Chavez-Pirson et al. |
| 7,321,605 B2 | 1/2008 | Albert |
| 7,321,713 B2 | 1/2008 | Akiyama et al. |
| 7,344,671 B2 * | 3/2008 | Basque et al. ................ 264/400 |
| 7,349,452 B2 | 3/2008 | Brennan, III et al. |
| 7,349,589 B2 | 3/2008 | Temelkuran et al. |
| 7,361,171 B2 | 4/2008 | Stoltz et al. |
| 7,365,859 B2 * | 4/2008 | Yun et al. ...................... 356/497 |
| 7,367,969 B2 | 5/2008 | Stoltz et al. |
| 7,413,565 B2 | 8/2008 | Wang et al. |
| 7,414,780 B2 | 8/2008 | Fermann et al. |
| 7,444,049 B1 | 10/2008 | Kim et al. |
| 7,518,788 B2 | 4/2009 | Fermann et al. |
| 7,584,756 B2 | 9/2009 | Zadoyan et al. |
| 7,674,719 B2 | 3/2010 | Li et al. |
| 7,675,674 B2 | 3/2010 | Bullington et al. |
| 7,751,118 B1 | 7/2010 | Di Teodoro et al. |
| 7,759,607 B2 | 7/2010 | Chism, II |
| 7,773,216 B2 | 8/2010 | Cheng et al. |
| 7,773,294 B2 | 8/2010 | Brunet et al. |
| 7,787,175 B1 | 8/2010 | Brennan, III et al. |
| 7,792,408 B2 | 9/2010 | Varming |
| 7,943,533 B2 | 5/2011 | Mizuno |
| 7,998,404 B2 | 8/2011 | Huang et al. |
| RE43,605 E | 8/2012 | O'Brien et al. |
| 8,338,746 B2 | 12/2012 | Sun et al. |
| 8,373,090 B2 | 2/2013 | Gale et al. |
| 2001/0009250 A1 | 7/2001 | Herman et al. |
| 2001/0021294 A1 | 9/2001 | Cai et al. |
| 2002/0003130 A1 | 1/2002 | Sun et al. |
| 2002/0051606 A1 | 5/2002 | Takushima et al. |
| 2002/0071454 A1 | 6/2002 | Lin |
| 2002/0095142 A1 | 7/2002 | Ming |
| 2002/0097761 A1 | 7/2002 | Sucha et al. |
| 2002/0115273 A1 | 8/2002 | Chandra et al. |
| 2002/0118934 A1 | 8/2002 | Danziger et al. |
| 2002/0153500 A1 | 10/2002 | Fordahl et al. |
| 2002/0167581 A1 | 11/2002 | Cordingley et al. |
| 2002/0167974 A1 | 11/2002 | Kennedy et al. |
| 2002/0176676 A1 | 11/2002 | Johnson et al. |
| 2002/0186915 A1 | 12/2002 | Yu et al. |
| 2003/0011782 A1 | 1/2003 | Tanno |
| 2003/0031410 A1 | 2/2003 | Schnitzer |
| 2003/0039442 A1 | 2/2003 | Bond et al. |
| 2003/0053508 A1 | 3/2003 | Dane et al. |
| 2003/0055413 A1 | 3/2003 | Altshuler et al. |
| 2003/0086647 A1 | 5/2003 | Willner et al. |
| 2003/0095266 A1 | 5/2003 | Detalle et al. |
| 2003/0122550 A1 * | 7/2003 | Kanamaru et al. ............ 324/537 |
| 2003/0129423 A1 * | 7/2003 | Mastromatteo et al. ...... 428/450 |
| 2003/0142705 A1 | 7/2003 | Hackel et al. |
| 2003/0156605 A1 | 8/2003 | Richardson et al. |
| 2003/0161378 A1 | 8/2003 | Zhang et al. |
| 2003/0178396 A1 | 9/2003 | Naumov et al. |
| 2003/0189959 A1 * | 10/2003 | Erbert et al. ..................... 372/25 |
| 2003/0202547 A1 | 10/2003 | Fermann et al. |
| 2003/0205561 A1 | 11/2003 | Iso |
| 2003/0214714 A1 | 11/2003 | Zheng |
| 2003/0223689 A1 | 12/2003 | Koch et al. |
| 2004/0000942 A1 | 1/2004 | Kapteyn et al. |
| 2004/0022695 A1 | 2/2004 | Simon et al. |
| 2004/0037505 A1 | 2/2004 | Morin |
| 2004/0042061 A1 | 3/2004 | Islam et al. |
| 2004/0069754 A1 * | 4/2004 | Bates et al. ............... 219/121.63 |
| 2004/0128081 A1 | 7/2004 | Rabitz et al. |
| 2004/0134894 A1 | 7/2004 | Gu et al. |
| 2004/0134896 A1 | 7/2004 | Gu et al. |
| 2004/0160995 A1 | 8/2004 | Sauter et al. |
| 2004/0226922 A1 | 11/2004 | Flanagan |
| 2004/0226925 A1 | 11/2004 | Gu et al. |
| 2004/0231682 A1 | 11/2004 | Stoltz et al. |
| 2004/0233944 A1 | 11/2004 | Dantus et al. |
| 2004/0263950 A1 | 12/2004 | Fermann et al. |
| 2005/0008044 A1 | 1/2005 | Fermann et al. |
| 2005/0018986 A1 | 1/2005 | Argyros et al. |
| 2005/0030540 A1 * | 2/2005 | Thornton ...................... 356/432 |
| 2005/0035097 A1 | 2/2005 | Stoltz |
| 2005/0061779 A1 | 3/2005 | Blumenfeld et al. |
| 2005/0065502 A1 | 3/2005 | Stoltz |
| 2005/0067388 A1 | 3/2005 | Sun et al. |
| 2005/0074974 A1 | 4/2005 | Stoltz |
| 2005/0077275 A1 | 4/2005 | Stoltz |
| 2005/0105865 A1 | 5/2005 | Fermann et al. |
| 2005/0107773 A1 | 5/2005 | Bergt et al. |
| 2005/0111073 A1 | 5/2005 | Pan et al. |
| 2005/0111500 A1 | 5/2005 | Harter et al. |
| 2005/0127049 A1 | 6/2005 | Woeste et al. |
| 2005/0154380 A1 | 7/2005 | DeBenedictis et al. |

(56) References Cited

U.S. PATENT DOCUMENTS

| | | |
|---|---|---|
| 2005/0163426 A1 | 7/2005 | Fermann et al. |
| 2005/0167405 A1 | 8/2005 | Stoltz et al. |
| 2005/0171516 A1 | 8/2005 | Stoltz et al. |
| 2005/0171518 A1 | 8/2005 | Stoltz et al. |
| 2005/0175280 A1 | 8/2005 | Nicholson |
| 2005/0177143 A1 | 8/2005 | Bullington et al. |
| 2005/0195726 A1 | 9/2005 | Bullington et al. |
| 2005/0213630 A1 | 9/2005 | Mielke et al. |
| 2005/0215985 A1 | 9/2005 | Mielke et al. |
| 2005/0218122 A1 | 10/2005 | Yamamoto et al. |
| 2005/0225846 A1 | 10/2005 | Nati et al. |
| 2005/0226278 A1 | 10/2005 | Gu et al. |
| 2005/0226287 A1 | 10/2005 | Shah et al. |
| 2005/0232560 A1 | 10/2005 | Knight et al. |
| 2005/0238070 A1 | 10/2005 | Imeshev et al. |
| 2005/0259944 A1 | 11/2005 | Anderson et al. |
| 2005/0265407 A1 | 12/2005 | Braun et al. |
| 2005/0271094 A1 | 12/2005 | Miller et al. |
| 2005/0271340 A1 | 12/2005 | Weisberg et al. |
| 2005/0274702 A1 | 12/2005 | Deshi |
| 2006/0050750 A1 | 3/2006 | Barty |
| 2006/0056480 A1 | 3/2006 | Mielke et al. |
| 2006/0064079 A1 | 3/2006 | Stoltz et al. |
| 2006/0081101 A1 | 4/2006 | Hayashi et al. |
| 2006/0084957 A1 | 4/2006 | Delfyett et al. |
| 2006/0093012 A1 | 5/2006 | Singh et al. |
| 2006/0093265 A1 | 5/2006 | Jia et al. |
| 2006/0096426 A1 | 5/2006 | Park |
| 2006/0096962 A1 | 5/2006 | Park |
| 2006/0120418 A1 | 6/2006 | Harter et al. |
| 2006/0126679 A1 | 6/2006 | Brennan, III et al. |
| 2006/0128073 A1* | 6/2006 | Sun et al. ............ 438/132 |
| 2006/0131288 A1 | 6/2006 | Sun et al. |
| 2006/0153254 A1* | 7/2006 | Franjic et al. ............ 372/30 |
| 2006/0159137 A1 | 7/2006 | Shah |
| 2006/0187974 A1 | 8/2006 | Dantus |
| 2006/0209908 A1 | 9/2006 | Pedersen et al. |
| 2006/0210275 A1 | 9/2006 | Vaissie et al. |
| 2006/0221449 A1 | 10/2006 | Glebov et al. |
| 2006/0249816 A1 | 11/2006 | Li et al. |
| 2006/0268949 A1 | 11/2006 | Gohle et al. |
| 2007/0025728 A1 | 2/2007 | Nakazawa et al. |
| 2007/0047965 A1 | 3/2007 | Liu et al. |
| 2007/0064304 A1 | 3/2007 | Brennan, III et al. |
| 2007/0098025 A1 | 5/2007 | Hong et al. |
| 2007/0121686 A1 | 5/2007 | Vaissie et al. |
| 2007/0151961 A1 | 7/2007 | Kleine et al. |
| 2007/0166965 A1 | 7/2007 | Tanaka et al. |
| 2007/0196048 A1 | 8/2007 | Galvanauskas et al. |
| 2007/0215581 A1 | 9/2007 | Kato et al. |
| 2007/0229939 A1 | 10/2007 | Brown et al. |
| 2007/0273960 A1 | 11/2007 | Fermann et al. |
| 2008/0050078 A1 | 2/2008 | Digonnet et al. |
| 2008/0058781 A1 | 3/2008 | Langeweyde et al. |
| 2008/0086038 A1* | 4/2008 | Thornton ............ 600/310 |
| 2008/0232407 A1 | 9/2008 | Harter et al. |
| 2008/0240184 A1 | 10/2008 | Cho et al. |
| 2009/0020511 A1 | 1/2009 | Kommera et al. |
| 2009/0045176 A1 | 2/2009 | Wawers et al. |
| 2009/0219610 A1 | 9/2009 | Mourou et al. |
| 2009/0244695 A1 | 10/2009 | Marcinkevicius et al. |
| 2009/0245302 A1 | 10/2009 | Baird et al. |
| 2009/0257464 A1 | 10/2009 | Dantus et al. |
| 2009/0273828 A1 | 11/2009 | Waarts et al. |
| 2009/0290151 A1 | 11/2009 | Agrawal et al. |
| 2009/0297155 A1 | 12/2009 | Weiner et al. |
| 2010/0013036 A1 | 1/2010 | Carey |
| 2010/0040095 A1 | 2/2010 | Mielke et al. |
| 2010/0072183 A1 | 3/2010 | Park |
| 2010/0118899 A1 | 5/2010 | Peng et al. |
| 2010/0142034 A1 | 6/2010 | Wise et al. |
| 2010/0181284 A1 | 7/2010 | Lee et al. |
| 2010/0276405 A1 | 11/2010 | Cho et al. |
| 2011/0049765 A1 | 3/2011 | Li et al. |
| 2011/0287607 A1 | 11/2011 | Osako et al. |
| 2012/0152915 A1 | 6/2012 | Srinivas et al. |

FOREIGN PATENT DOCUMENTS

| | | |
|---|---|---|
| EP | 0691563 | 1/1996 |
| EP | 1462831 | 9/2004 |
| GB | 2331038 A | 12/1999 |
| JP | 405104276 A | 4/1993 |
| JP | 8171103 | 7/1996 |
| JP | 11189472 | 7/1999 |
| JP | 2003181661 | 7/2003 |
| JP | 2003344883 | 12/2003 |
| JP | 2005174993 | 6/2005 |
| WO | WO9428972 | 12/1994 |
| WO | WO2004105100 | 12/2004 |
| WO | WO2004114473 | 12/2004 |
| WO | WO2005018060 | 2/2005 |
| WO | WO2005018061 | 2/2005 |
| WO | WO2005018062 | 2/2005 |
| WO | WO2005018063 | 2/2005 |
| WO | WO2007034317 | 3/2007 |

OTHER PUBLICATIONS

Stevenson et al., Femtosecond Optical Transfection of Cells: Viability and Efficiency, Optics Express, vol. 14, No. 16, pp. 7125-7133, Aug. 7, 2006.

Stock et al., "Chirped Pulse Amplification in an Erbium-doped fiber Oscillator/Erbium-doped Fiber Amplifier System", Optics Communications, North-Holland Publishing Co., Amsterdam, NL, vol. 106, No. 4/5/06, Mar. 15, 1994, pp. 249-252, XP000429901, ISSN: 0030-4018.

Strickland et al., "Compression of Amplified Chirped Optical Pulses", Optics Communications, North-Holland Publishing Co., Amersterdam, NL, vol. 56, No. 3, Dec. 1, 1985, pp. 219-221, XP024444933 ISSN: 0030-4018 (retrieved on 1985-12-011.

Temelkuran, B. et al., "Wavelength-scalable Hollow Optical Fibres with Large Photonic Bandgaps for CO2 Laser Transmission," Nature, Dec. 12, 2002, pp. 650-653.

Thurston, R.N. et al., "Analysis of Picosecond Pulse Shape Synthesis by Spectral Masking in a Grating Pulse Compressor," IEEE Journal of Quantum Electronics, vol. EQ-22, No. 5, pp. 682-696, May 1986.

Tirlapur et al., "Targeted Transfection by Femtosecond Laser," Nature Publishing Group, vol. 418, pp. 290-291, Jul. 18, 2002.

Tsai et al., "Ultrashort Pulsed Laser Light," Optics & Photonics News, pp. 25-29, Jul. 2004.

Vaissie et al., "Desktop Ultra-Short Pulse Laser at 1552 nm,"Ultrashort Pulse Laser Materials Interaction Workshop (Raydiance)—Directed Energy Professional Society (DEPS), Sep. 28, 2006.

Weiner, A.M. et al., "Synthesis of Phase-coherent, Picosecond Optical Square Pulses," Optics Letters, vol. 11, No. 3, pp. 153-155, Mar. 1986.

Weiner, A.M., "Femtosecond Optical Pulse Shaping and Processing," Prog. Quant. Electr. 1995, vol. 19, pp. 161-237, 1995.

Weiner, A.M., "High-resolution femtosecond Pulse Shaping," Journal of the Optical Society of America B. vol. 5, No. 8, pp. 1563-1572, Aug. 1988.

Wells, D.J., "Gene Therapy Progress and Prospects: electroporation and Other Physical Methods," Gene Therapy, Nature Publishing Group, vol. 11, pp. 1363-1369, Aug. 5, 2004, (http://www.nature.com/gt).

White, W.E., et al., "Compensation of Higher-order Frequency-dependent Phase Terms in Chirped-pulse Amplification Systems," Optics Letters, vol. 18, No. 16, pp. 1343-1345, Aug. 15, 1993.

Yamakawa et al., "1 Hz, 1 ps, terawatt Nd: glass laser", Optics Communications, North-Holland Publishing Co. Amsterdam, NL, vol. 112, No. 1-2, Nov. 1, 1994, pp. 37-42, XP024424285.

Yan et al., Ultrashort Pulse Measurement Using Interferometric Autocorrelator Based on Two-photon-absorbtion Detector at 1.55 µm Wavelength Region., 2005, Proceedings of SPIE vol. 5633, Advanced Materials and Devices for Sensing and Imaging II, pp. 424-429.

(56) References Cited

OTHER PUBLICATIONS

Yeh, et al. "Theory of Bragg Fiber", Journal of the Optical Society America, Sep. 1978, pp. 1196, vol. 68, No. 9., pp. 1196-1201.
Yi, Y. et al., "Sharp Bending of On-Chip silicon Bragg Cladding Waveguide With Light Guiding on Low Index Core Materials", IEEE Journal of Selected Topics in Quantum Electronics, vol. 12, No. 6, Nov./Dec. 2006, pp. 1345-1348.
Yi, Y., et al., "On-chip Si-based Bragg Cladding Waveguide with High Index Contrast Bilayers", Optics Express, vol. 12, No. 20, Oct. 4, 2004, pp. 4775-4780.
Yin, D. et al., "Integrated ARROW Waveguides with Hollow Cores", Optics Express, vol. 12, No. 12, Jun. 14, 2004, pp. 2710-2715.
Zhou, S. et al., "Compensation of nonlinear Phase Shifts with Third-order Dispersion in Short-pulse Fiber Amplifiers," Optics Express, vol. 13, No. 13, pp. 4869-2877, Jun. 27, 2005.
Agostinelli, J. et al., "Optical Pulse Shaping with a Grating Pair," Applied Optics, vol. 18, No. 14, pp. 2500-2504, Jul. 15, 1979.
Anastassiou et al., "Photonic Bandgap Fibers Exploiting Omnidirectional Reflectivity Enable Flexible Delivery of Infrared Lasers for Tissue Cutting," Proceedings of the SPIE—the International Society for Optical Engineering, SPIE, US, vol. 5317, No. 1, Jan. 1, 2004, pp. 29-38, XP002425586 ISSN: 0277-786X.
Benoit, G. et al., "Dynamic All-optical Tuning of Transverse Resonant Cavity Modes in Photonic Bandgap Fibers," Optics Letters, vol. 30, No. 13, Jul. 1, 2005, pp. 1620-1622.
Chen, L. et al., "Ultrashort Optical Pulse Interaction with Fibre Gratings and Device Applications," 1997, Canaga, located at http://www.collectionscanada.ca/obj/s4/f2/dsk2/ftp04/mq29402.pfd.
Chen, X. et al., "Highly Birefringent Hollow-core Photonic Bandgap Fiber," Optics Express, vol. 12, No. 16, Aug. 9, 2004, pp. 3888-3893.
Chen, Y. et al., "Dispersion-Managed Mode Locking", Journal of the Optical Society of America B, Nov. 1999, pp. 1999-2004, vol. 16, No. 11, Optical Society of America.
Dasgupta, S. et al., "Design of Dispersion-Compensating Bragg Fiber with an Ultrahigh Figure of Merit," Optics Letters, Aug. 1, 2005, vol. 30, No. 15, Optical Society of America.
De Matos et al., "Multi-kilowatt, Picosecond Pulses from an All-fiber Chirped Pulse Amplification System Using Air-core Photonic Bandgalp Fiber", Lasers and Electro-optics, 2004, (CLEO), Conference on San Francisco, CA USA, May 20-21, 2004, Piscataway, NJ, USA, IEEE, vol. May 17, 2004, pp. 973-974, XP010745448 ISBN: 978-1-55752-777-6.
De Matos, C.J.S. et al., "All-fiber Chirped Pulse Amplification using Highly-dispersive Air-core Photonic Bandgap Fiber," Nov. 3, 2003, Optics Express, pp. 2832-2837, vol. 11, No. 22.
Delfyett, P. et al., "Ultrafast Semiconductor Laser-Diode-Seeded Cr:LiSAF Rengerative Amplifier System", Applied Optics, May 20, 1997, pp. 3375-3380, vol. 36, No. 15, Octoical Society of America.
Eggleton, et al., "Electrically Tunable Power Efficient Dispersion Compensating Fiber Bragg Grating," IEEE Photonics Technology Letters, vol., 11, No. 7, pp. 854-856, Jul. 1999.
Engeness et al., "Dispersion Tailoring and Compensation by Modal Interations in Omniguide Fibers," Optics Express, May 19, 2003, pp. 1175-1196, vol. 11, No. 10.
Fink et al., "Guiding Optical Light in Air Using an All-Dielectric Structure," Journal of Lightwave Technology, Nov. 1999, pp. 2039-2041, vol. 17, No. 11.
Folkenberg, J.R., et al., "Broadband Single-polarization Photonic Crystal Fiber," Optics Letters, vol. 30, No. 12, Jun. 15, 2005, pp. 1446-1448.
Folkenberg, J.R., et al., "Polarization Maintaining Large Mode Area Photonic Crystal Fiber," Optics Express vol. 12, No. 5, Mar. 8, 2004, pp. 956-960.
Futami, F., et al., "Wideband Fibre Dispersion Equalisation up to Fourth-order for Long-distance Sub-picosecond Optical Pulse Transmission," Electronics Letters, vol. 35, No. 25, Dec. 9, 1999.
Galvanauskas, A. et al., "Chirped-pulse-amplification Circuits for Fiber Amplifiers, Based on Chirped-period Quasi-phase, matching gratings", Optics Letters, Nov. 1, 1998, p. 1695-1697, vol. 23, No. 21, Optical Society of America.

Hartl et al., "In-line high energy Yb Fiber Laser Based Chirped Pulse Amplifier System", Laser and Electro-Optics, 2004, (CLEO) Conference of San Francisco, CA USA May 20-21, 2004, Piscataway, NJ, USA, IEEE, vol. 1, May 17, 2004, pp. 563-565, XP010745382, ISBN: 978-1-55752-777-6.
Hellstrom, E. et al., "Third-order Dispersion Compensation Using a Phase Modulator", Journal of Lightwave Technology, vol. 21, No. 5, pp. 1188-1197, May 2003.
Heritage, J. P. et al., "Picosecond Pulse Shaping by Spectral Phase and Amplitude Manipulation," Optics Letters, vol. 10, No. 12, pp. 609-611, Dec. 1985.
Heritage, J.P. et al., "Spectral Windowing of Frequency-Modulated Optical Pulses in a Grating Compressor," Applied Physics Letters, vol. 47, No. 2, pp. 87-89, Jul. 15, 1985.
Hill, K. et al., "Fiber Bragg Grating Technology Fundamentals and Overview," Journal of Lightwave Technology, Aug. 1997, vol. 15, No. 8, pp. 1263-1276.
Ibanescu et al., "Analysis of Mode Structure in Hollow Dielctric Waveguide Fibers," Physical Review E 67, 2003, The American Physical Society.
Jiang, et al., "Fully Dispersion Compensated ~500 fs Pulse Transmission Over 50 km Single Mode Fiber," Optics Letters, vol. 30, No. 12, pp. 1449-1451, Jun. 15, 2005.
Jiang, et al., "Fully Dispersion Compensated ~500 fs Pulse Transmission Over 50 km Single Mode Fiber," Purdue University ECE Annual Research Summary, Jul. 1, 2004-Jun. 30, 2005.
Killey, et al., "Electronic Dispersion Compensation by Signal Predistortion Using Digital Processing and a Dual-Drive Mach-Zehnder Modulator," IEEE Photonics Technology Letters, vol. 17, No. 3, pp. 714-716, Mar. 2005.
Kim, K. et al., "1.4kW High Peak Power Generation from an All Semiconductor Mode-locked Master Oscillator Power Amplifier System Based on eXtreme Chirped Pulse Amplification (X-CPA)", Optics Express, Jun. 2, 2005, pp. 4600-4606, vol. 13, No. 12.
Koechner, "Solid State Laser Engineering", Oct. 29, 1999, Section 5.5, pp. 270-277, 5th Edition, Springer.
Kwon, et al., "Tunable Dispersion Slope Compensator Using a Chirped Fiber Bragg Grating Tuned by a Fan-shaped Thin Metallic Heat Channel," IEEE Photonics Technology Letters, vol. 18, No. 1, pp. 118-120, Jan. 1, 2006.
Kyungbum, Kim et al., "1.4kW High Peak Power Generation from an all Semiconductor Mode-locked Master Oscillator Power Amplifier System Based on eXtreme Chirped Pulse Amplification (X-CPA)", Optics Express, Jun. 2, 2005, pp. 4600-4606, vol. 13, No. 12.
Levy et al., "Engineering Space-Variant Inhomogeneous Media for Polarization Control," Optics Letters, Aug. 1, 2004, pp. 1718-1720, vol. 29, No. 15, Optical Society of America.
Liao, Kai-Hsiu et al., "Large-aperture Chirped Volume Bragg Grating Based Fiber CPA System," Optics Express, Apr. 16, 2007, vol. 15, No. 8, pp. 4876-4882.
Limpert et al., "All Fiber Chiped-Pulse Amplification System Based on Compression in Air-Guiding Photonic Bandgap Fiber", Optics Express, Dec. 1, 2003, vol. 11, No. 24, pp. 3332-3337.
Lo, S. et al., "Semiconductor Hollow Optical Waveguides Formed by Omni-directional Reflectors", Optics Express, vol. 12, No. 26, Dec. 27, 2004, pp. 6589-6593.
Malinowski A. et al., "Short Pulse High Power Fiber Laser Systems," Proceedings of the 2005 Conference on Lasers and Electro-Optics (CLEO), Paper No. CThG3, pp. 1647-1649, May 26, 2005.
Mehier-Humbert, S. et al., "Physical Methods for Gene Transfer: Improving the Kinetics of Gene Delivery Into Cells," Advanced Drug Delivery Reviews, vol. 57, pp. 733-753, 2005.
Mohammed, W. et al., "Selective Excitation of the TE01 Mode in Hollow-Glass Waveguide Using a Subwavelength Grating," IEEE Photonics Technology Letters, Jul. 2005, vol. 17, No. 7, IEEE.
Nibbering, E.T.J., et al. "Spectral Determination of the Amplitude and the Phase of Intense Ultrashort Optical Pulses," Journal Optical Society of America B, vol. 13, No. 2, pp. 317-329, Feb. 1996.
Nicholson, J. et al., "Propagation of Femotsecond Pulses in Large-mode-area, Higher-order-mode Fiber," Optics Letters, vol. 31, No. 21, 2005, pp. 3191-3193.

(56) References Cited

OTHER PUBLICATIONS

Nishimura et al., "In Vivo Manipulation of Biological Systems with Femtosecond Laser Pulses," Proc. SPIE 6261, 62611J, pp. 1-10, 2006.

Noda, J. et al., "Polarization-maintaining Fibers and Their Applications", Journal of Lightwave Technology, vol. Lt-4, No. 8 Aug. 1986, pp. 1071-1089.

Palfrey et al., "Generation of 16-FSEC Frequency-tunable Pulses by Optical Pulse compression" Optics Letters, OSA, Optical Society of america, Washington, DC, USA, vol. 10, No. 11, Nov. 1, 1985, pp. 562-564, XP000710358 ISSN: 0146-9592.

Pelusi, M. et al., "Electrooptic Phase Modulation of Stretched 250-fs Pulses for Suppression of Third-Order Fiber Disperson in Transmission", IEEE Photonics Technology Letters, vol. 11, No. 11, Nov. 1999, pp. 1461-1463.

Pelusi, M. D., et al., "Phase Modulation of Stretched Optical Pulses for Suppression of Third-order Dispersion Effects in fibre Transmission," Electronics Letters, vol. 34, No. 17, pp. 1675-1677, Aug. 20, 1998.

Price et al., "Advances in High Power, Short Pulse, Fiber Laser Systems and Technology", Photonics West 2005, San Jose, California, Jan. 2005, pp. 5709-3720.

Price et al., "Advances in High Power, Short Pulse, Fiber Laser Systems and Technology", Proceedings of SPIE—vol. 5709, Fiber Lasers II: Technology, Systems, and Applications, Apr. 2005, pp. 184-192.

Ramachandran, S., et al., "High-power Amplification in a 2040-μm2 Higher Order Mode," SPIE Photonics West 2007, Post-deadline.

Resan et al., "Dispersion-Managed Semiconductor Mode-Locked Ring Laser", Optics Letters, Aug. 1, 2003, pp. 1371-1373, vol. 28, No. 15, Optical Society of America.

Schreiber, T., et al., "Design and High Power Operation of a Stress-induced single Polarization Single-transverse Mode LMA Yb-doped Photonic Crystal Fiber," Fiber Lasers III: Technology, Systems, and Applications, Andrew J.W. Brown, Johan Nilsson, Donald J. Harter, Andreas Tunnermann, eds., Proc. of SPIE, vol. 6102, pp. 61020C-1-61020C-9, 2006.

Schreiber, T., et al., "Stress-induced Single-polarization Single-transverse Mode Photonic Crystal Fiber with Low Nonlinearity," Optics Express, vol. 13, No. 19, Sep. 19, 2005, pp. 7621-7630.

\* cited by examiner

METHODS AND SYSTEMS FOR TRIMMING CIRCUITS

CROSS-REFERENCES TO RELATED APPLICATIONS

The present application is a continuation-in-part of and claims the priority benefit of U.S. patent application Ser. No. 11/538,048, filed Oct. 2, 2006 and entitled "Methods and Systems for Trimming Circuits," which is a continuation-in-part of and claims the priority benefit of U.S. patent application Ser. No. 10/957,271, filed on Oct. 1, 2004, entitled "Semiconductor Manufacturing Using Optical Ablation," which, in turn, claims the benefit and priority of U.S. provisional patent application Ser. No. 60/508,136, filed Oct. 2, 2003, "Semiconductor Manufacturing Using Optical Ablation"; and is a continuation-in-part of and claims the priority benefit of U.S. patent application Ser. No. 10/916,366, filed on Aug. 11, 2004, entitled "Optical Ablation Using Material Composition Analysis," which, in turn, claims the benefit and priority of U.S. Provisional Patent Applications:

Ser. No. 60/494,102, filed Aug. 11, 2003, "Controlling Repetition Rate Of Fiber Amplifier";

Ser. No. 60/494,275, filed Aug. 11, 2003, "Controlling Pulse Energy Of A Fiber Amplifier By Controlling Pump Diode Current";

Ser. No. 60/494,274, filed Aug. 11, 2003, "Pulse Energy Adjustment For Changes In Ablation Spot Size";

Ser. No. 60/503,578, filed Sep. 17, 2003, "Controlling Optically-Pumped Optical Pulse Amplifiers"; and Ser. No. 60/512,807, filed Oct. 20, 2003, "Material Composition Analysis Using Optical Ablation."

All of the above applications are hereby incorporated herein by reference.

BACKGROUND

1. Technical Field

The present invention relates in general to the field of circuit manufacturing and, more particularly, circuit manufacture using optical lasers.

2. Related Art

Circuit manufacture sometimes requires that a circuit be trimmed to meet certain specifications. Circuit trimming includes the removal of excess material from a circuit so that the circuit can perform more optimally. Trimming is sometimes accomplished using laser ablation. Laser ablation removes material from a spot by vaporizing the material at the spot using a laser beam.

Established techniques of circuit trimming include the use of q-switched lasers to produce laser pulses. A q-switched laser typically generates laser pulses having a duration of several nanoseconds and a repetition rate from a few hertz to approximately a few kilohertz.

A problem with trimming techniques of the prior art is a risk of thermal and/or photoelectric effects to material around the ablated spot. These effects may result in disturbances to the operation of the circuit being trimmed, particularly when the circuits include digital components. The possibility of these disturbances typically requires that digital circuits be reset after each ablation step to allow for accurate testing of circuit performance. Resetting of the circuit requires a time-consuming reinitialization of the circuit between each ablation step. For example, when the trimming disrupts a logic state required for testing of a digital circuit, it may be that signals must be sent to the digital circuit in order to bring it back to the required logic state. Because circuits may need to be trimmed and tested multiple times to optimize the total trimming, the times required for one or more reinitializations can significantly slow down the trimming process. Having to reinitialize the circuit may also adversely affect precision of the trimming process because there is an incentive to use fewer ablation steps, requiring fewer reinitializations, in order to complete trimming within a reasonable time. There is, therefore, a need for methods and systems of trimming circuits that allow for circuit testing without requiring that the circuit be reinitialized.

SUMMARY OF THE INVENTION

The methods and systems of the present invention remove material from a circuit by delivering laser pulses to a spot within the material to be ablated. In various embodiments, the laser pulses are of near-infrared wavelength and/or configured to ablate material from the spot with minimal temperature and/or photoelectric disturbance. This minimal disturbance may allow for trimming and testing of the circuit without reinitializing (e.g., resetting) the circuit. Various embodiments further include sensing the composition of ablated material and adjustment of the laser pulses to more optimally trim the circuit in response to this composition. Some embodiments include a targeting or focusing component configured to improve the precision of circuit trimming. The circuit trimmed may include digital and/or analog components.

Various embodiments include a method of ablating material from a plurality of circuits by delivering, in parallel, optical laser pulses of near-infrared wavelength to a plurality of circuits to be trimmed. The parallel trimming of multiple circuits includes ablating a spot on each circuit, testing each circuit, and if necessary, ablating each circuit again. Parallel trimming includes the performance of these steps concurrently on multiple circuits. In some embodiments, a train of laser pulses from a single source is divided up into several pulse trains, each of which is directed at a different member of a plurality of circuits being trimmed in parallel.

Various embodiments comprise a system for circuit trimming including a laser device, configured to produce and deliver optical laser pulses of near-infrared wavelength toward a spot on a circuit, and a testing component configured to monitor performance of the circuit. Some embodiments of the system are configured to adjust parameters of the laser pulses based on instructions received from a user directly, or based on instructions generated responsive to, for example, a composition of the material at the spot. For example, an optional composition analysis component is configured to determine the ablation threshold of the material being ablated and generate instructions to adjust the parameters of the laser pulses accordingly. The composition of the material may be inputted by a user, or the composition may be identified by a composition sensor.

Various embodiments of the invention include a method of removing material from the surface of a first circuit comprising generating a first laser pulse using a pulse generator, targeting a spot on the first circuit using a focusing component, delivering the first laser pulse to the spot on the first circuit, the first circuit including a digital component, ablating material from the spot using the first laser pulse without changing a state of the digital component, and testing performance of the first circuit following the step of ablating material, the testing being performed without reinitializing the circuit between the steps of ablating material and testing performance.

Various embodiments of the invention include a method of removing material from the surface of a plurality of circuits comprising generating laser pulses using a pulse generator, targeting at least one spot on each of the plurality of circuits using a focusing component, delivering the laser pulses to the at least one spot on each of the plurality of circuits, ablating material from the at least one spot on each of the plurality of circuits using the laser pulses, testing performance of each of the plurality of circuits by measuring an indicative property of the performance of each of the plurality of circuits without resetting each of the plurality of circuits between the steps of ablating material and testing performance, and repeating the steps of ablating material and testing performance on each of the plurality of circuits in parallel.

Various embodiments of the invention include a system for trimming a circuit, comprising a pulse generator configured to produce laser pulses having a) a wavelength greater than 1100 nanometers and a duration of less than 10 picoseconds, or b) a wavelength of greater than 1350 nanometers, a delivery component configured to deliver the laser pulses to a spot on a surface of the circuit to remove material from the circuit, a testing component configured to test an indicative property of performance of the circuit following the material removal without reinitializing the circuit between the material removal and the test.

Various embodiments of the invention include a set of digital electronic circuits trimmed to a precision of at least one part in fifty using one of the methods described herein.

In some embodiments, a method of removing material from the surface of a first circuit may comprise generating a first laser pulse using a pulse generator; targeting a spot on the first circuit using a focusing component; delivering the first laser pulse to the spot on the first circuit, the first circuit including a digital component; ablating material from the spot using the first laser pulse without changing a state of the digital component; and testing performance of the first circuit following the step of ablating material, the testing being performed without reinitializing the circuit between the steps of ablating material and testing performance. Targeting the spot on the first circuit may comprise generating a second laser pulse using a pulse generator; delivering a second laser pulse to a sacrificial piece of material; detecting the position of the ablation caused by the second laser pulse with a vision system that forms an image; and using this image to guide the first laser to the spot.

In further embodiments, a method of removing material from the surface of a first circuit comprises generating a first laser pulse using a pulse generator; targeting a spot on the first circuit using a focusing component; delivering the first laser pulse to the spot on the first circuit, the first circuit including a digital component; ablating material from the spot using the first laser pulse without changing a state of the digital component; and testing performance of the first circuit following the step of ablating material, the testing being performed without reinitializing the circuit between the steps of ablating material and testing performance. Targeting the spot on the first circuit comprises generating a second laser pulse using a pulse generator; delivering a second laser pulse to a sacrificial piece of material; aligning a visible alignment beam to identify the location of the ablation caused by the second laser pulse; and using the alignment beam to guide the first laser to the spot.

DETAILED DESCRIPTION OF THE INVENTION

The present invention includes methods of and systems for circuit manufacturing. Some embodiments include the use of sub-nanosecond laser pulses of near-infrared wavelength to trim a circuit by ablating material from the circuit and testing performance of the circuit after ablation without resetting (e.g., reinitializing) the circuit between the ablation and the testing. The laser pulses can be configured in terms of wavelength, power, duration, repetition rate, and/or the like, such that more optimal ablation of the material from the circuit occurs.

Figure 1:
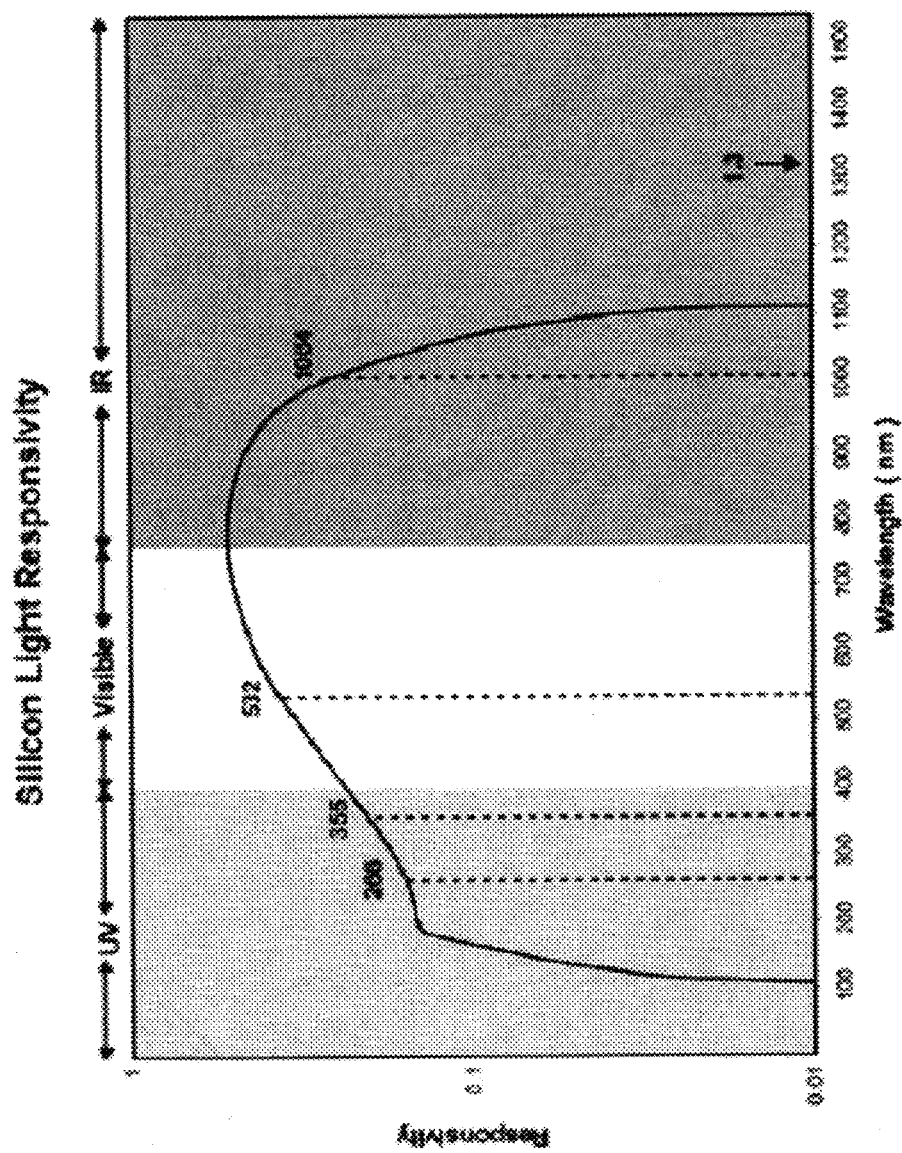
FIG. 1 is a graph depicting the responsivity of silicon to light of different wavelengths.

Circuits, analog and/or digital, may be composed of various materials, including silicon and silicon-based materials. FIG. 1 is a graph depicting the responsivity of silicon to light of different wavelengths. As illustrated, silicon is generally responsive to light with wavelengths ranging from about 100 nanometers to about 1100 nanometers. For light wavelengths falling out of this range, there is minimal absorption by silicon. Those wavelengths that experience minimal absorption by silicon and/or silicon-based material are considered "invisible" to the material. The invisible wavelengths that fall above 1100 nanometers include wavelengths within the "near-infrared" region of the electromagnetic spectrum. For example, laser pulses in the near-infrared wavelength, such as 1300 nanometers, are invisible to silicon and therefore, produce minimal thermoelectric or photoelectric effect in silicon and some silicon-based materials.

Compared to q-switched laser pulses, sub-nanosecond laser pulses can be configure to ablate material with fewer thermal effects. Because the photon energy within a laser pulse of less than approximately 10 picoseconds is delivered in a shorter period of time, the material absorbing the energy is ablated before the delivered energy can be thermally transferred to other parts of the circuit.

Figure 2:
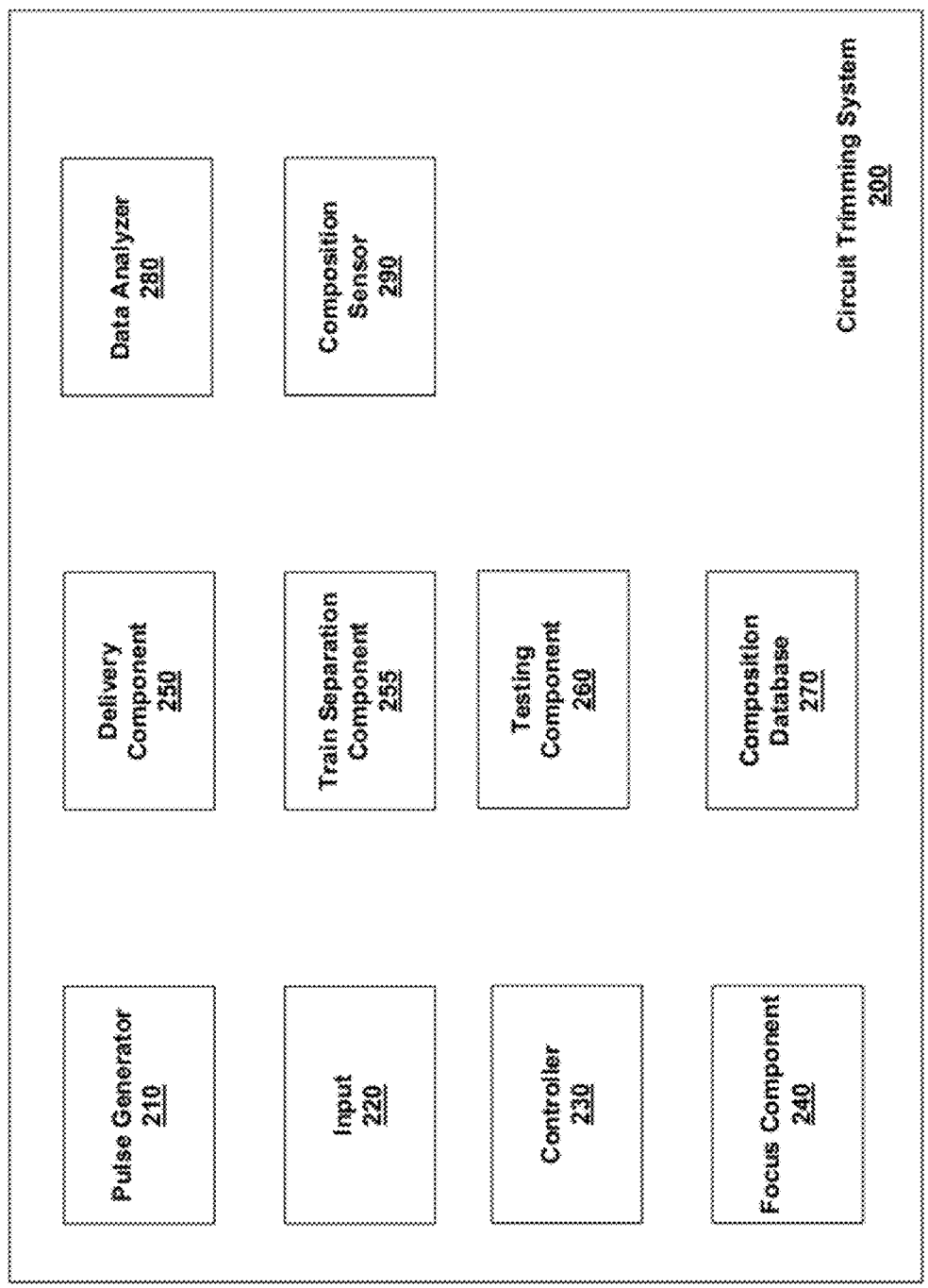
FIG. 2 is block diagram illustrating various embodiments of a circuit trimming system.

FIG. 2 is block diagram illustrating various embodiments of a circuit trimming system 200, according to various embodiments of the present invention. Circuit Trimming System 200 is configured to trim a circuit by generating laser pulses to ablate material from a spot on the circuit, delivering the pulses to the spot, and testing circuit performance to determine whether further ablation is required. In some embodiments, this process can be repeated without disrupting the operation of the circuit, and thus, the circuit need not be reinitialized before subsequent ablation and testing.

Circuit Trimming System 200 includes a Pulse Generator 210, an optional Input 220, an optional Controller 230, a Focus Component 240, a Delivery Component 250, Train Separation Component 255, and a Testing Component 260. The Circuit Trimming System 200 may further include a Composition Database 270, a Data Analyzer 280, and a Composition Sensor 290, configured to adjust laser ablation based on a composition of the material ablated.

Pulse Generator 210 is configured to generate optical laser pulses of near-infrared wavelength. In various embodiments, generating laser pulses using Pulse Generator 210 includes mode-locking, chirping, amplifying, compressing, and/or the like. Modelocking produces a train (e.g., pulse train or series of pulses) of laser pulses including pulse widths on the order of picoseconds, or femtoseconds. Chirping stretches a laser pulse temporally, increasing the pulse duration by several orders of magnitude. For example, a pulse can be stretched from a duration of under 1 picosecond to approximately 1 nanosecond, which is a change of three orders of magnitude (1000 times). This decreases the pulse peak power by the same factor such that the total power contained in the pulse remains approximately constant. A stretched pulse may be amplified to increase the energy of the pulse, and subsequently compressed to produce an amplified sub-nanosecond pulse. In various embodiments, Pulse Generator 210 is configured to generate laser pulses less than 1 nanosecond, 100 picoseconds, 50 picoseconds, 25 picoseconds, 10 picoseconds, 1 picosecond, or 0.5 picoseconds in width. In various embodiments, the laser pulses produced by the Pulse Generator 210 have a wavelengths of at least 1100 nanometers (nm), 1200 nm, 1300 nm, 1350 nm, 1400 nm, 1500 nm, 1550 nm, 1600 nm, or 2000 nm.

In some embodiments, Pulse Generator 210 includes one or more optical fiber configured for amplification, compression or delivery of optical pulses to the spot. For example, Pulse Generator 210 may include an optical fiber amplifier and/or a Bragg fiber compressor.

In various embodiments, the Pulse Generator 210 may be configured to produce laser pulses according to preset parameters. Examples of these preset parameters include the wavelength of the laser pulses, pulse duration, pulse repetition rate, pulse power, focal position, and/or the like. Some embodiments allow the instructions for achieving the preset parameters to be received by an optional Input 220. Input 220 may include a keyboard, keypad, a network device, a graphical user interface, a control panel, an electrical communication port, and/or the like. Input 220 may receive instructions regarding using such techniques as mode-locking, chirping, amplifying, compressing, and/or the like. In various embodiments, the repetition rate of the laser pulses generated using Pulse Generator 210 is at least 500 hertz, 1 kilohertz (kHz), 5 kHz, 10 kHz, 20 kHz, 50 kHz, 100 kHz, 200 kHz, 500 kHz, or 1000 kHz. In various embodiments, trimming a circuit includes generating at least 500, 1000, 2000, 5000, 10,000, 15,000, 20,000, or 50,000 laser pulses. These generated pulses are optionally used to trim more than one circuit in parallel.

From Input 220, the instructions are delivered to Controller 230, which is configured to adjust the operation of the Pulse Generator 210 responsive to the instructions. In various embodiments, the instructions may control which laser generation techniques, such as chirping, stretching, amplifying, and/or the like, are used and to what extent. Further, the instructions may be configured to select a pulse energy, a pulse repetition rate, a pulse duration, a pulse focus, an ablation spot on a circuit, and/or the like.

Controller 230 includes a computing device, personal computer, digital control device, processor, or the like, as well as logic configured to carry out instructions and otherwise control Circuit Trimming System 200. This logic may include hardware, firmware, and/or software embodied on a computer readable medium.

Focus Component 240 is configured to focus the laser pulses on a spot on a surface of a circuit containing material to be ablated. Some embodiments of Focus Component 240 allow for a user to manually focus laser pulses on the spot. For example, in various embodiments of the present invention, a user may place thin conformal material, such as a glass cover slip or semi-transparent plastic, on a circuit and deliver laser pulses of various sub-ablation power levels to a covered spot on the circuit until the spot begins to luminesce or fluoresce, as detected by a spectrograph, photo detector, or the like. The luminescence or fluorescence may then be used to manually guide the laser pulses into the spot having the material to be ablated. Some embodiments of Focus Component 240 are configured to automatically locate a spot including material to be ablated. In these embodiments, the circuit and focal spot are mechanically positioned relative to each other using processor controlled positioning equipment.

Delivery Component 250 is configured to deliver laser pulses to the Focus Component 240. In various embodiments, the Delivery Component 250 uses a waveguide to guide and deliver waves of laser pulses to the spot. Examples of waveguides may include optical fibers, such as Bragg fibers or the like. In various embodiments, Focus Component 240 and Delivery Component 250 may be combined in a single component. In some embodiments, Delivery Component 250 includes a plurality of optical fibers configured to deliver light pulses to a plurality of Focus Component 240 to trim a plurality of circuits in parallel. In some embodiments, Delivery Component 250 includes an optical fiber configured to compress optical pulses. As such, Delivery Component 250 may be configured to both deliver and compress laser pulses.

Optional Train Separation Component 255 is configured to generate more than one train of laser pulses from the laser pulses produced within Pulse Generator 210. In some embodiments, Train Separation Component 255 includes a pulse selector. In these embodiments, the pulse selector is configured to select individual pulses for inclusion in a first, second and/or further pulse train. For example, the pulse selector may be configured to direct every other pulse into one of two alternative pulse trains. In some embodiments, Train Separation Component 255 includes a pulse splitter, such as a partial reflector. In these embodiments, Train Separation Component 255 is configured to generate more than one pulse train by directing part of each pulse to a different pulse train.

Train Separation Component 255 may be configured to receive the output of Pulse Generator 210 or may be included within Pulse Generator 210. For example, in some embodiments, Train Separation Component 255 is disposed between an amplifier and a plurality of compressors within Pulse Generator 210. As such, Train Separation Component 225 may be configured to generate trains of laser pulses prior to pulse compression. The pulse train outputs of Train Separation Component 225 are then each separately directed into one of the plurality of compressors.

If the Pulse Generator 210 generates laser pulses on the order of 10 picosecond in width or less and of near-infrared wavelength greater than 1100 nm, the ablation will typically result in significantly fewer thermal effects than would laser pulses of a nanosecond or longer. Thus, the need to reset the circuit before testing may be diminished. Testing Component 260 is configured to monitor and test the performance of the circuit in order to determine whether the performance of the circuit meets the user's standards and/or whether further trimming is necessary. Aspects of circuit performance that may be tested include signal slew rate, sample and hold times, clock frequency, speed, power, efficiency, resistance, impedance, resonance, and/or the like. In various embodiments, Testing Component 260 can monitor circuit performance either continuously or intermittently throughout the trimming process, including before, during, and/or after each ablation step.

Various embodiments are configured to of tailor the parameters of the laser pulses for use with various compositions. For example, some embodiments are configured to generate instructions based on composition of the material to be ablated. Generating instructions may include retrieving information from a Composition Database 270 including physical properties of various compositions. For example, in some embodiments the identity of a composition is used to retrieve ablation thresholds from Composition Database 270. These ablation thresholds are optionally used by a Data Analyzer 280 to generate instructions for adjusting laser pulse parameters to achieve more optimal ablation. These instructions may be delivered to and received by Input 220, which communicates them to Controller 230. Various embodiments enable a user to enter a composition's identity into Composition Database 270.

Various embodiments optionally include a Composition Sensor 290 configured to identify the composition of a material at a targeted spot and use the composition's identity to retrieve an ablation threshold from the Composition Database 270. In some embodiments, Composition Sensor 290 includes an emission spectrometer configured to identify the composition of a material. Various embodiments include controlling ablation based on spectroscopic analysis of ablated material. This may be done by generating and delivering an initial optical pulse to a surface, causing particles of material to be emitted through ablation. These particles may be analyzed to at least partially determine the material's composition and, using the analysis of material composition, to adjust pulse energy and/or stop ablation. In some embodiments, Composition Sensor 290 includes a Laser Induced Breakdown Spectrometer (LIBS). In other embodiments, Composition Sensor 290 includes luminescence, fluorescence mass analysis, and/or atomic adsorption analysis of material being ablated.

Because different materials may be responsive to different wavelengths and may have different ablation thresholds, different wavelengths and pulse energies can be used to selectively ablate different parts of circuits composed of multiple materials. For example, ablation can be controlled by sensing a material included in a stop-indication layer or by sensing a difference in composition occurring on the surface of, or within the circuit. A stop-indication layer has a different composition than the material to be ablated. In various embodiments, a laser can be configured to ablate material at a spot until the stop-indication layer is exposed and identified. Further, knowing the ablation thresholds of the materials in a circuit can allow for adjustment of the parameters of the laser pulses so that only a targeted material is ablated from the circuit.

Figure 3:
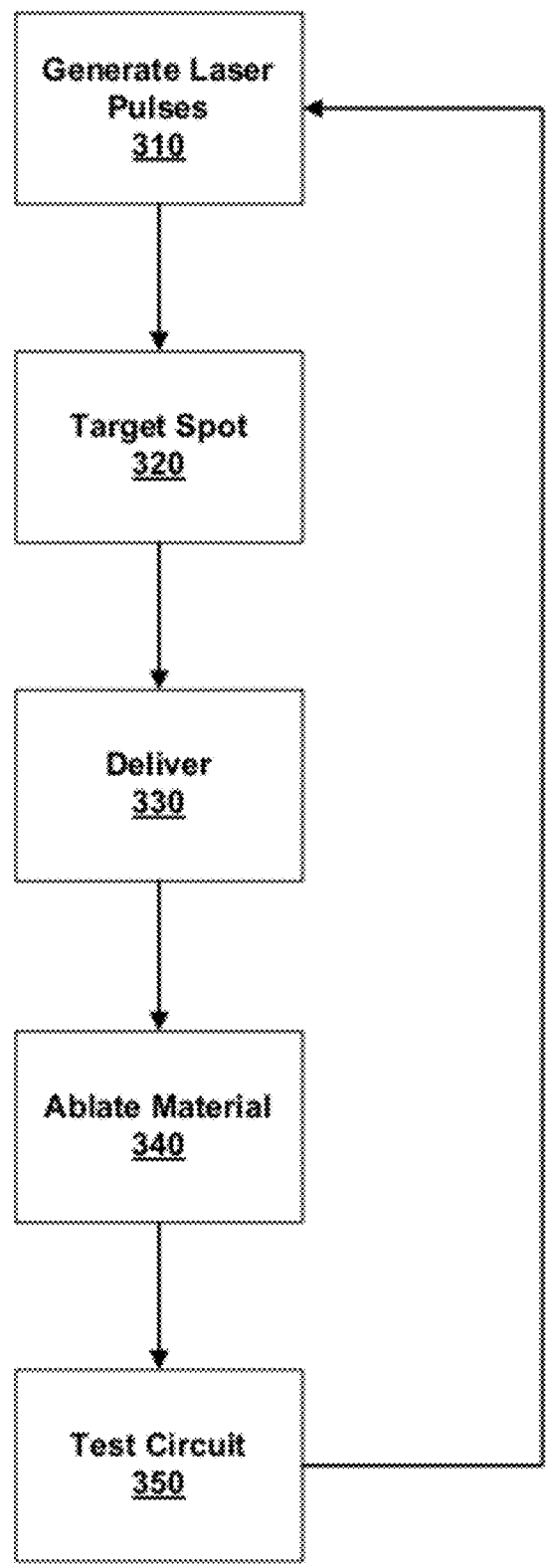
FIG. 3 is a flowchart depicting various embodiments of a method of operation of an exemplary circuit trimming system.

FIG. 3 is a flowchart depicting various embodiments of a method of operation of an exemplary circuit trimming system. In this method, laser pulses of near-infrared wavelength are generated and aimed at a spot on a circuit. The laser pulses are then delivered to the spot, to ablate material from the spot. As the material is ablated, the performance of the circuit can be monitored and tested to determine whether performance meets specifications or whether further trimming is required.

More specifically, in Generate Laser Pulses Step 310, a laser device generates optical laser pulses of near-infrared wavelength, using Pulse Generator 210. The generation of laser pulses may occur automatically according to preset parameters, or laser pulse generation may optionally follow instructions received through Input 220 and carried out by Controller 230. For example, the laser device may be programmed for trimming silicon circuits. In such a case, optimal ablation can be achieved with the laser pulses having a set of known parameters. Further, the optimal settings to produce such laser pulses may already have been preset by a manufacturer or user.

Generate Laser Pulses Step 310 optionally includes using Train Separation Component 255 to generate more than one pulse train.

In a Target Spot Step 320, the laser device is targeted to a spot on a circuit containing the material to be removed. Various embodiments include allowing a user to manually choose the spot. Some embodiments of the present invention are configured to automatically determine one or more spots including material to be ablated to achieve circuit trimming. In these embodiments, Target Spot Step 320 may be automatically performed using automated positioning equipment.

In a Deliver Step 330, the Delivery Component 250 is used to deliver an optical laser pulse to the spot targeted in Target Spot Step 320. When the power of the laser pulses rises to or above the material's ablation threshold, the material at the spot is ablated. In various embodiments, a single component can perform Target Spot Step 320 and Deliver Step 330. In some embodiments, a plurality of Delivery Components 250 are used to deliver a plurality of laser pulses to different circuits for trimming in parallel, in Deliver Step 330. For example, one embodiments includes delivering a first of at least two pulse trains to a first circuit of the plurality of circuits and delivering a second of the at least two pulse trains to a second circuit of the plurality of circuits.

In an Ablate Material Step 340, material is removed from the spot using the laser pulses delivered to the spot in Deliver Step 330. In various embodiments, Ablate Material Step 340 includes adjustment of laser parameters, either individually or in combination, to produce specific ablation effects on material at a spot on a circuit.

For example, by setting the pulse intensity so that only the brightest part of the laser pulse is above the ablation threshold, the precision of material removal can exceed that of a diffraction limited laser focus. As such, the area of the material ablated may be smaller than the diffraction limited focal spot of the laser. In various embodiments a material ablation area is smaller than $3/4$, $2/3$, $1/2$, $1/3$, and $1/4$ of the diffraction limited focal spot. Trimming, optionally using sub-diffraction limited areas, may include generating at least 500, 1000, 2000, 5000, 10,000, 15,000, 20,000, or 50,000 laser pulses to trim a circuit. In various embodiments, using such numbers of laser pulses, each pulse configured to ablate a relatively small amount of material, results in trimming precision of at least 1 part in 20, 50, 100, 250, 500, 1000, and/or 5000.

In various embodiments, Circuit Trimming System 200 is configured to generate laser pulses at repetition rates above 0.5 kHz, such repetition rates allow for practical trimming of circuits in parallel. These circuits may be fabricated from a single wafer or from a plurality of wafers. Rather than trimming each circuit consecutively (e.g., one after another), parallel trimming allows for multiple circuits to be trimmed concurrently. For example, in one approach, a spot on each of a plurality of circuits is ablated in a first ablation phase, then, if needed, material is again ablated from each of the plurality of circuits in a second ablation phase. The first ablation phase and the second ablation phase being separate in time. Parallel trimming can include, but does not require, simultaneous ablation of each circuit. Various embodiments apply the method of the present invention to multiple circuits in parallel. For example, various embodiments may include trimming at least 2, 8, 16, 32, 128, 256 or more circuits in parallel. In various embodiments, 30, 40, 50, 60, 70, 80, 90, 100, and/or 200 circuits may be trimmed per minute. Circuits trimmed in parallel may be disposed together on a wafer.

Test Circuit Step 350 includes measuring an indicative property of a performance of the circuit to determine whether circuit performance meets the user's standards or whether further trimming is necessary. In various embodiments, Test Circuit Step 250 may occur continuously or intermittently at throughout the trimming process, including before, during, and/or after each ablation. In various embodiments, trimming in parallel includes testing in parallel. Like parallel ablation, parallel testing is not necessarily simultaneous across multiple circuits. In some embodiments, parallel testing allows for each circuit to be tested between ablation phases.

In some embodiments, Focus Component 240 is configured to focus the laser pulses on a spot on a surface of a circuit containing material to be ablated. Some embodiments of Focus Component 240 allow for a user to manually focus laser pulses on the spot. For example, in various embodiments of the present invention, a user may place a sacrificial piece of material of similar dimensions as the circuit in place of the circuit and deliver laser pulses of appropriate ablative power levels, in order to mark the sacrificial material. A vision system may detect the brief emission of light from the ablation event or it may detect the resulting mark on the sacrificial material. The position of this brief emission or surface mark, in the field of view of the vision system, can then be used to manually guide the laser pulses into the spot having the material to be ablated, when the sacrificial material is replaced by a circuit containing material to be ablated.

In some embodiments, the position of the surface mark can be indicated by an aiming beam of a visible wavelength. This aiming beam can then be used to manually guide the laser pulses into the spot having material to be ablated, when the sacrificial material is replaced by a circuit containing material to be ablated.

The embodiments discussed herein are illustrative of the present invention. Therefore, while near-infrared laser pulses are discussed here by way of example, alternative embodiments may include sub-nanosecond laser pulses of other wavelengths. Further, as embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A method of removing material from the surface of a first circuit, the method comprising:
    generating a first laser pulse using a pulse generator;
    targeting a spot on the first circuit using a focusing component;
    delivering the first laser pulse to the spot on the first circuit, the first circuit including a digital component;
    ablating material from the spot using the first laser pulse without changing a state of the digital component by using the first laser pulse having a wavelength in a near-infrared region and a duration equal or shorter than sub-nanosecond; and
    testing performance of the first circuit following the step of ablating material, the testing being performed without reinitializing the circuit between the steps of ablating material and testing performance,
    targeting the spot on the first circuit comprises:
        generating a second laser pulse using a pulse generator;
        delivering a second laser pulse to a sacrificial piece of material;
        detecting the position of the ablation caused by the second laser pulse with a vision system that forms an image; and
    using this image to guide the first laser to the spot.

2. The method of claim 1, further comprising sensing a composition of the material ablated from the spot.

3. The method of claim 1, wherein the first laser pulse has a wavelength greater than 1100 nanometers and a duration of less than 10 picoseconds.

4. The method of claim 1, wherein the first laser pulse has a wavelength greater than 1350 nanometers.

5. The method of claim 1, wherein the first laser pulse is delivered as a member of a train of pulses having a repetition rate of at least 1 kHz.

6. The method of claim 1, wherein an area from which the material is ablated has a diameter less than a diameter of a diffraction limited focal spot of the first laser pulse.

7. The method of claim 1, wherein ablating the material comprises generating at least 5000 laser pulses including the first laser pulse.

8. The method of claim 1, wherein ablating the material comprises generating at least 500 laser pulses.

9. The method of claim 1, further comprising ablating material from another spot in parallel with the step of ablating material from the spot.

10. The method of claim 1, further including generating a second laser pulse and using the second laser pulse to trim a second circuit in parallel with the first circuit.

11. The method of claim 1, further including ablating material from a second circuit using a second laser pulse and testing performance of the second circuit, in parallel with ablating material from the spot using the first laser pulse and testing performance of the first circuit.

12. The method of claim 1, wherein the step of generating a first laser pulse includes compressing the first laser pulse using an optical fiber.

13. The method of claim 1, wherein the step of generating a first laser pulse includes amplifying the first laser pulse using an optical fiber.

14. A method of removing material from the surface of a first circuit, the method comprising:
    generating a first laser pulse using a pulse generator;
    targeting a spot on the first circuit using a focusing component;
    delivering the first laser pulse to the spot on the first circuit, the first circuit including a digital component;
    ablating material from the spot using the first laser pulse without changing a state of the digital component by using the first laser pulse having a wavelength in a near-infrared region and a duration equal or shorter than sub-nanosecond; and
    testing performance of the first circuit following the step of ablating material, the testing being performed without reinitializing the circuit between the steps of ablating material and testing performance,
    targeting the spot on the first circuit comprises:
        generating a second laser pulse using a pulse generator;
        delivering a second laser pulse to a sacrificial piece of material;
    aligning a visible alignment beam to identify the location of the ablation caused by the second laser pulse; and
    using the alignment beam to guide the first laser to the spot.

15. The method of claim 14, further comprising sensing a composition of the material ablated from the spot.

16. The method of claim 14, wherein the first laser pulse has a wavelength greater than 1100 nanometers and a duration of less than 10 picoseconds.

17. The method of claim 14, wherein the first laser pulse has a wavelength greater than 1350 nanometers.

18. The method of claim 14, wherein the first laser pulse is delivered as a member of a train of pulses having a repetition rate of at least 1 kHz.

19. The method of claim 14, wherein an area from which the material is ablated has a diameter less than a diameter of a diffraction limited focal spot of the first laser pulse.

20. The method of claim 14, wherein ablating the material comprises generating at least 5000 laser pulses including the first laser pulse.

21. The method of claim 14, wherein ablating the material comprises generating at least 500 laser pulses.

22. The method of claim 14, further comprising ablating material from another spot in parallel with the step of ablating material from the spot.

23. The method of claim 14, further including generating a second laser pulse and using the second laser pulse to trim a second circuit in parallel with the first circuit.

24. The method of claim 14, further including ablating material from a second circuit using a second laser pulse and testing performance of the second circuit, in parallel with ablating material from the spot using the first laser pulse and testing performance of the first circuit.

25. The method of claim 14, wherein the step of generating a first laser pulse includes compressing the first laser pulse using an optical fiber.

26. The method of claim 14, wherein the step of generating a first laser pulse includes amplifying the first laser pulse using an optical fiber.

* * * * *